(12) United States Patent
Hayashi

(10) Patent No.: US 12,527,140 B2
(45) Date of Patent: Jan. 13, 2026

(54) METHOD OF MANUFACTURING LIGHT EMITTING ELEMENT

(71) Applicant: NICHIA CORPORATION, Anan (JP)

(72) Inventor: Seiichi Hayashi, Anan (JP)

(73) Assignee: NICHIA CORPORATION, Anan (JP)

( * ) Notice: Subject to any disclaimer, the term of this patent is extended or adjusted under 35 U.S.C. 154(b) by 705 days.

(21) Appl. No.: 17/903,179

(22) Filed: Sep. 6, 2022

(65) Prior Publication Data

US 2023/0076732 A1    Mar. 9, 2023

(30) Foreign Application Priority Data

Sep. 8, 2021 (JP) .................................. 2021-146505

(51) Int. Cl.
| | |
|---|---|
| *H10H 20/01* | (2025.01) |
| *H10H 20/81* | (2025.01) |
| *H10H 20/812* | (2025.01) |
| *H10H 29/10* | (2025.01) |

(52) U.S. Cl.
CPC ...... *H10H 29/10* (2025.01); *H10H 20/01335* (2025.01); *H10H 20/812* (2025.01); *H10H 20/8215* (2025.01)

(58) Field of Classification Search
CPC ............. H10H 29/10; H10H 20/01335; H10H 20/812; H10H 20/825; H10H 20/811; H01L 21/02458; H01L 21/02507; H01L 21/0254; H01L 21/0262
See application file for complete search history.

(56) References Cited

U.S. PATENT DOCUMENTS

| | | | |
|---|---|---|---|
| 2004/0066816 A1 | 4/2004 | Collins et al. | |
| 2010/0207100 A1* | 8/2010 | Strassburg | ........... H10H 20/825 257/15 |
| 2013/0001509 A1* | 1/2013 | Fudeta | ................. H10H 20/825 257/E33.025 |

(Continued)

FOREIGN PATENT DOCUMENTS

| | | |
|---|---|---|
| JP | H08-264907 A | 10/1996 |
| JP | 2004-128502 A | 4/2004 |

(Continued)

*Primary Examiner* — Ajay Ojha
*Assistant Examiner* — Sandra Milena Rodriguez Villanu
(74) *Attorney, Agent, or Firm* — Foley & Lardner LLP

(57) ABSTRACT

A method of manufacturing a light emitting element includes: forming a first n-type semiconductor layer containing an n-type impurity; forming, on the first n-type semiconductor layer, a first superlattice layer, which is grown at a first growth temperature; forming, on the first superlattice layer, a first light emitting layer; forming, on the first light emitting layer, a first p-type semiconductor layer containing a p-type impurity; forming, on the first p-type semiconductor layer, a tunnel junction part; forming, on the tunnel junction part, a second n-type semiconductor layer containing an n-type impurity; forming, on the second n-type semiconductor layer, a second superlattice layer, which is grown at a second growth temperature lower than the first growth temperature; forming, on the second superlattice layer, a second light emitting layer; and forming, on the second light emitting layer, a second p-type semiconductor layer containing a p-type impurity.

20 Claims, 3 Drawing Sheets

(56) References Cited

U.S. PATENT DOCUMENTS

| | | | |
|---|---|---|---|
| 2018/0019374 A1* | 1/2018 | Nagata | H10H 20/811 |
| 2019/0140134 A1 | 5/2019 | Mann et al. | |
| 2019/0305173 A1 | 10/2019 | Mann et al. | |
| 2019/0305174 A1 | 10/2019 | Mann et al. | |
| 2020/0006592 A1* | 1/2020 | Prineas | H10H 20/813 |
| 2020/0127157 A1 | 4/2020 | Mann et al. | |
| 2021/0202790 A1 | 7/2021 | Hayashi | |
| 2022/0384679 A1* | 12/2022 | Tonkikh | H10H 20/841 |

FOREIGN PATENT DOCUMENTS

| | | |
|---|---|---|
| JP | 2008-091459 A | 4/2008 |
| JP | 2021-502713 A | 1/2021 |
| JP | 2021-106245 A | 7/2021 |
| WO | WO-2021/150688 A1 | 7/2021 |

\* cited by examiner

METHOD OF MANUFACTURING LIGHT EMITTING ELEMENT

CROSS-REFERENCE TO RELATED APPLICATION

This application claims priority to Japanese Patent Application No. 2021-146505, filed on Sep. 8, 2021, the disclosure of which is hereby incorporated by reference in its entirety.

BACKGROUND

The present invention relates to a method of manufacturing a light emitting element.

Japanese Patent Publication No. 2004-128502 discloses a light emitting device that includes a tunnel junction between two stacked active regions. There is a need to increase the light output of such a light emitting device by forming a tunnel junction while maintaining high crystalline quality of the high impurity concentration n-type semiconductor layer and p-type semiconductor layer that constitute the tunnel junction.

SUMMARY

One object of the present invention is to provide a method of manufacturing a high light output light emitting element.

A method of manufacturing a light emitting element according to an embodiment of the present invention includes forming a first n-type semiconductor layer containing an n-type impurity, forming on the first n-type semiconductor layer a first superlattice layer at a first growth temperature, forming on the first superlattice layer a first light emitting layer, forming on the first light emitting layer a first p-type semiconductor layer containing a p-type impurity, forming on the first p-type semiconductor layer a tunnel junction part, forming on the tunnel junction part a second n-type semiconductor layer containing an n-type impurity, forming on the second n-type semiconductor layer a second superlattice layer at a second growth temperature, forming on the second superlattice layer a second light emitting layer, and forming on the second light emitting layer a second p-type semiconductor layer containing a p-type impurity, wherein the second growth temperature is lower than the first growth temperature.

A method of manufacturing a light emitting element according to an embodiment of the present invention can provide a high light output light emitting element.

DETAILED DESCRIPTION

Figure 1:
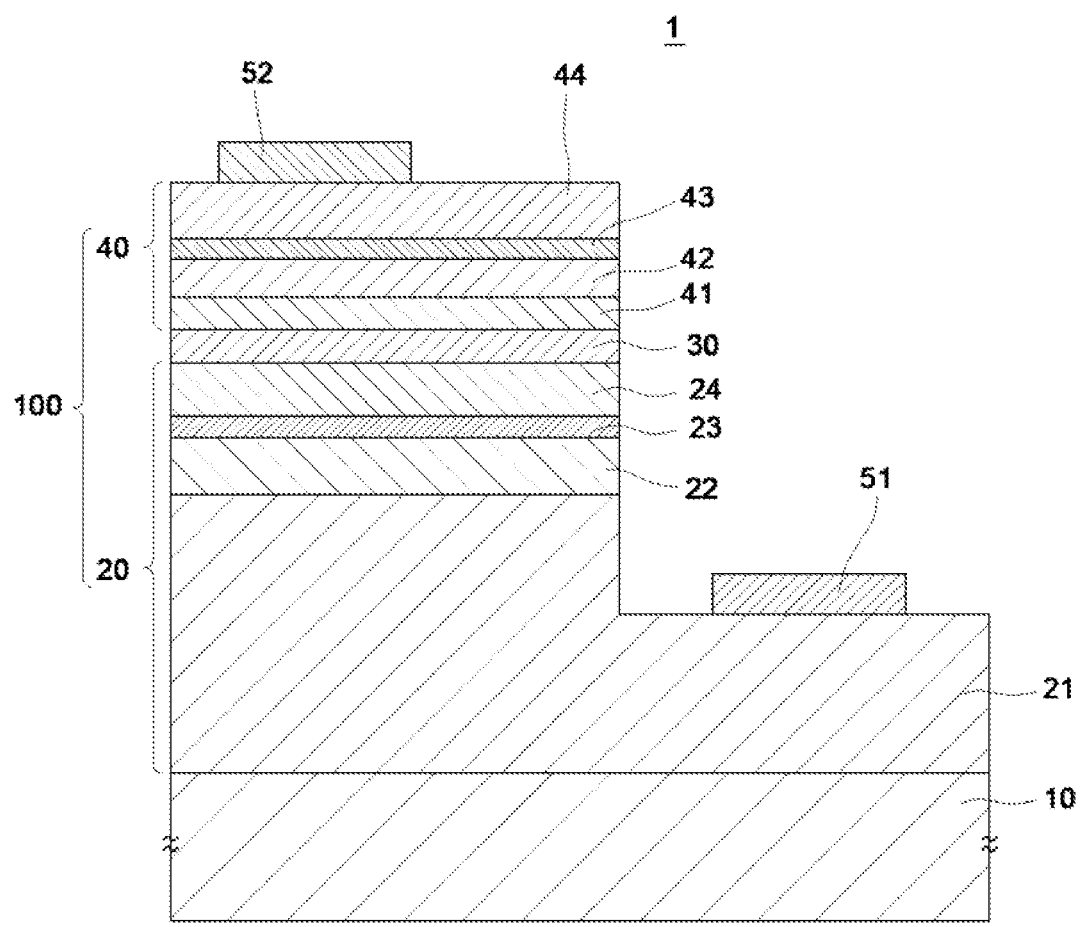
FIG. 1 is a schematic cross-sectional view of the structure of a light emitting element according to one embodiment of the present invention.

Methods of manufacturing a light emitting element according to embodiments of the present invention will be explained below. The drawings referenced in the description below depict schematic representations of the present invention. Therefore, the scale of and intervals and positional relationships between the members might be exaggerated, or a portion of a member omitted. In the description below, the same designations and reference numerals denote the same or similar members as a rule, for which the explanation might be omitted as appropriate.

FIG. 1 is a schematic cross-sectional view of a light emitting element 1 according to one embodiment of the present invention. The light emitting element 1 has a substrate 10, and a semiconductor structure 100 disposed on the substrate 10. The semiconductor structure 100 has, successively from the substrate 10 side, a first light emitting part 20, a tunnel junction part 30, and a second light emitting part 40. The first light emitting part 20 has a first n-type semiconductor layer 21, a first superlattice layer 22, a first light emitting layer 23, and a first p-type semiconductor layer 24. The second light emitting part 40 has a second n-type semiconductor layer 41, a second superlattice later 42, a second light emitting layer 43, and a second p-type semiconductor layer 44. The light emitting element 1 has an n-side electrode 51 electrically connected to the first n-type semiconductor layer 21 and a p-side electrode 52 electrically connected to the second p-type semiconductor layer 44.

The material for a substrate 10 is, for example, sapphire, silicon, SiC, GaN, or the like. In this embodiment, a sapphire substrate 10 is used. A buffer layer may be disposed between the substrate 10 and the first light emitting part 20. For the buffer layer, for example, a semiconductor layer made of AlGaN, AlN, or the like, can be used.

A semiconductor structure 100 is a stack structure in which a plurality of nitride semiconductor layers are stacked. Nitride semiconductors can include all semiconductors obtained by varying the composition ratio x and y within their ranges in the chemical formula $In_xAl_yGa_{1-x-y}N$ ($0 \le x \le 1$, $0 \le y \le 1$, $x+y \le 1$).

A first n-type semiconductor layer 21 is disposed on the substrate 10. The first n-type semiconductor layer 21 includes a nitride semiconductor layer containing an n-type impurity. For the n-type impurity, for example, silicon (Si), germanium (Ge), or the like is used. The first n-type semiconductor layer 21 can have a multilayer structure that includes a plurality of nitride semiconductor layers. The first n-type semiconductor layer 21 may include an undoped nitride semiconductor layer. From the standpoint of promoting current diffusion, the thickness of the first n-type semiconductor layer 21 is preferably set, for example, in a range of 1 μm to 20 μm. An undoped layer refers to a layer that is not intentionally doped with an n-type impurity and/or a p-type impurity. In the case in which an undoped layer is adjacent to a layer that is intentionally doped with an n-type impurity and/or a p-type impurity, the undoped layer might contain the n-type and/or a p-type impurity that diffused from the adjacent layer.

A first superlattice layer 22 is disposed on the first n-type semiconductor layer 21. The first super lattice layer 22 has a multilayer structure in which two or more layers having different lattice constants are alternately stacked. The first superlattice layer 22 has a structure made up of alternating layers of undoped GaN and undoped InGaN, for example.

The first superlattice layer 22 includes, for example, 15 to 25 sets of an undoped GaN layer and an undoped InGaN layer. The total thickness of the first superlattice layer 22 can be set, for example, in a range of 30 nm to 150 nm.

A first light emitting layer 23 is disposed on the first superlattice layer 22. The first light emitting layer 23, for example, has a multi-quantum well structure that includes a plurality of first well layers and a plurality of first barrier layers. For the first well layers, for example, InGaN, AlGaN, or the like is used. For the first barrier layers, for example, GaN, AlGaN, or the like is used. The band gap energies of the first barrier layers are larger than the band gap energies of the first well layers. The first well layers and the first barrier layers included in the first light emitting layer 23, for example, are undoped layers. An n-type impurity and/or p-type impurity may be contained in at least some of the second well layers and the second barrier layers included in the first light emitting layer 23.

The first light emitting layer 23 emits, for example, ultraviolet or visible light. The first light emitting layer 23 can emit, for example, blue light or green light as visible light. The peak emission wavelength of blue light is in a range of 430 nm to 490 nm. The peak emission wavelength of green light is in a range of 500 nm to 540 nm. The peak emission wavelength of ultraviolet light is 400 nm at most.

A first p-type semiconductor layer 24 is disposed on the first light emitting layer 23. The first p-type semiconductor layer 24 includes a nitride semiconductor layer containing a p-type impurity. For the p-type impurity, for example, magnesium (Mg) or the like is used. The first p-type semiconductor layer 24 can have a multilayer structure that includes a plurality of nitride semiconductor layers. The first p-type semiconductor layer 24 may include an undoped nitride semiconductor layer. The thickness of the first p-type semiconductor layer 24 can be set in a range of 30 nm to 200 nm.

A tunnel junction part 30 is disposed between a first p-type semiconductor layer 24 and a second n-type semiconductor layer 41. The tunnel junction part 30 includes an n-type impurity and/or p-type impurity. The tunnel junction part 30 includes at least one of the semiconductor layers: a p-type semiconductor layer having a higher p-type impurity concentration than that of the first p-type semiconductor layer 24 and an n-type semiconductor layer having a higher n-type impurity concentration than that of the second n-type semiconductor layer 41. The total thickness of the tunnel junction part 30 can be set, for example, in a range of 30 nm to 100 nm.

A second n-type semiconductor layer 41 is disposed on the tunnel junction part 30. The second n-type semiconductor layer 41 includes a nitride semiconductor layer containing an n-type impurity. The second n-type semiconductor layer 41 can have a multilayer structure that includes a plurality of nitride semiconductor layers. The second n-type semiconductor layer 41 may include an undoped nitride semiconductor layer. The thickness of the second n-type semiconductor layer 41 can be set, for example, in a range of 30 nm to 500 nm.

A second superlattice layer 42 is disposed on the second n-type semiconductor layer 41. The second superlattice layer 42 has a multilayer structure in which two or more layers having different lattice constants are alternately stacked. The second superlattice layer 42 has a structure in which GaN layers doped with an n-type impurity and InGaN layers doped with an n-type impurity are alternately stacked, for example. The second superlattice layer 42 includes, for example, 15 to 25 sets of alternating layers of n-type impurity doped GaN and n-type impurity doped InGaN. The n-type impurity can be contained in either the GaN layers or the InGaN layers. For example, the GaN layer may be n-type impurity doped layers, and the InGaN layers may be undoped layers.

The thickness of the second superlattice layer 42 can be set smaller than the thickness of the first superlattice layer 22. This can reduce the spreading of a V pit formed on the upper face of the second superlattice layer 42 as compared to the case of the same thickness as the first superlattice layer 22 to thereby improve the crystalline quality of the second light emitting layer 43 to be formed on the second superlattice layer 42. The thickness of the second superlattice layer 42 can be set, for example, in a range of 30 nm to 150 nm. In the case of setting a smaller thickness for the second superlattice layer 42 than the first superlattice layer 22, for example, the thickness of the first superlattice layer 22 is set in a range of 50 nm to 70 nm, and the thickness of the second superlattice layer 42 is set in a range of 30 nm to 50 nm.

A second light emitting layer 43 is disposed on the second superlattice layer 42. The second light emitting layer 43 has, for example, a multi-quantum well structure that includes a plurality of second well layers and a plurality of second barrier layers. For the second well layers, for example, InGaN, AlGaN, or the like is used. For the second barrier layers, for example, GaN, AlGaN, or the like is used. The band gap energies of the second barrier layers are larger than the band gap energies of the second well layers. The second well layers and the second barrier layers included in the second light emitting layer 43 are, for example, undoped layers. An n-type impurity and/or a p-type impurity may be contained in at least some of the second well layers and the second barrier layers included in the second light emitting layer 43.

The second light emitting layer 43 emits ultraviolet or visible light. For example, the second light emitting layer 43 can emit blue or green light as visible light. The first light emitting layer 23 and the second light emitting layer 43 may emit different light. For example, the first light emitting layer 23 may be formed to emit blue light, while forming the second light emitting layer 43 to emit green light.

A second p-type semiconductor layer 44 is disposed on the second light emitting layer 43. The second p-type semiconductor layer 44 includes a nitride semiconductor layer containing a p-type impurity. For the p-type impurity, for example, magnesium (Mg) or the like is used. The second p-type semiconductor layer 44 can have a multilayer structure that includes a plurality of nitride semiconductor layers. The second p-type semiconductor layer 44 may include an undoped nitride semiconductor layer. The thickness of the second p-type semiconductor layer 44 can be set, for example, to 30 nm to 200 nm.

An n-side electrode 51 is disposed on the first n-type semiconductor layer 21 and electrically connected to the first n-type semiconductor layer. A p-side electrode 52 is disposed on the second p-type semiconductor layer 44 and electrically connected to the second p-type semiconductor layer.

A forward voltage is applied across the n-side electrode 51 and the p-side electrode 52. At this time, a reverse voltage applies across the first p-type semiconductor layer 24 and the second n-type semiconductor layer 41. The tunneling effect resulting from this allows the electrons in the p-side valence band to tunnel through the tunnel junction part 30 into the n-side conduction band. This can supply electrons and holes to the first light emitting layer 23 and the second light emitting layer 43, allowing the first light emitting layer 23 and the second light emitting layer 43 to emit light.

In order to achieve such a tunneling effect, a pn junction needs to be formed by a layer doped with a high concentration p-type impurity and a layer doped with a high concentration n-type impurity. Narrowing the thickness of the depletion layer formed at this time can efficiently achieve the tunneling of electrons, thereby reducing the drive voltage Vf. For example, in the case in which the tunnel junction part 30 contains Mg as a p-type impurity, the Mg concentration is in a range of $5\times10^{19}/cm^3$ to $2\times10^{21}/cm^3$. In the case in which the tunnel junction part 30 contains Si as an n-type impurity, the Si concentration is in a range of $1\times10^{21}/cm^3$ to $5\times10^{21}/cm^3$.

Because two light emitting layers, the first light emitting layer 23 and the second light emitting layer 43, are stacked in the semiconductor structure 100, the light emitting element 1 can have a higher light output per unit area as compared to a light emitting element having one light emitting layer. In this embodiment, the example of light emitting element 1 that has two light emitting parts, the first light emitting part 20 and the second light emitting part 40, has been explained, but the light emitting element 1 may include three or more light emitting parts.

Figure 2:
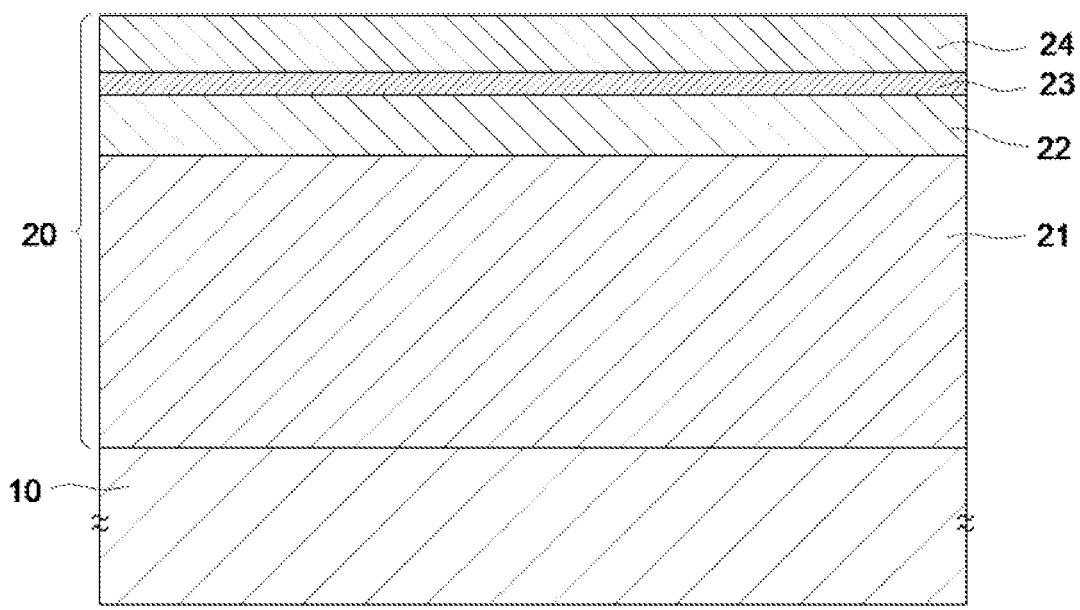
FIG. 2 is a schematic diagram explaining a method of manufacturing a light emitting element according to an embodiment of the present invention.
Figure 3:
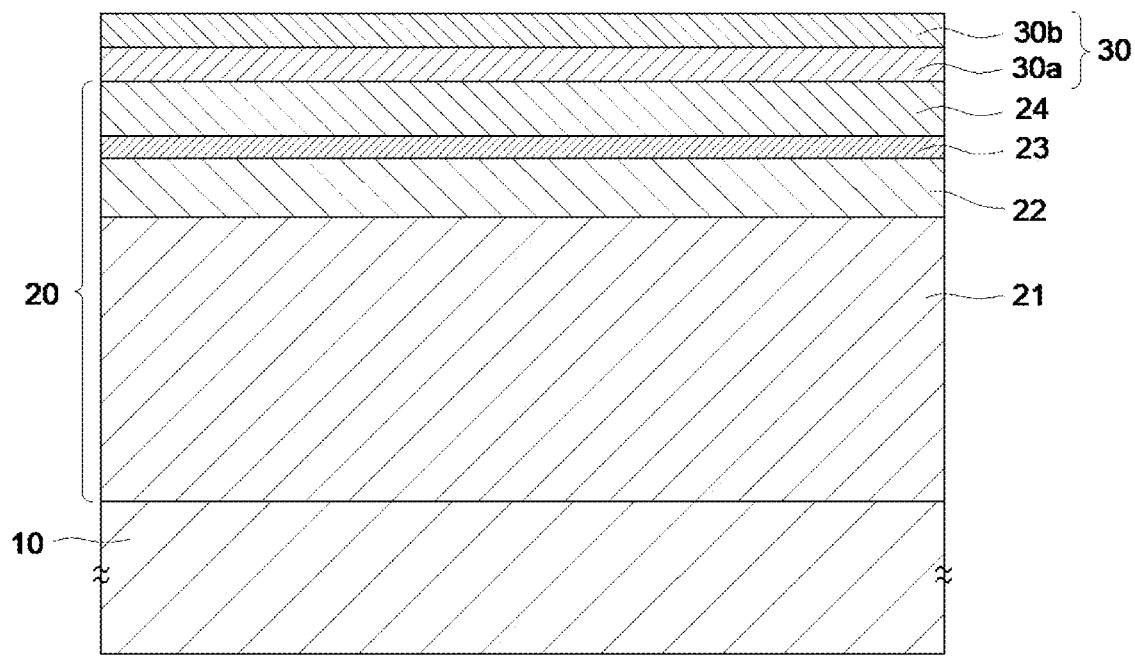
FIG. 3 is a schematic diagram explaining the method of manufacturing a light emitting element according to the embodiment of the present invention.
Figure 4:
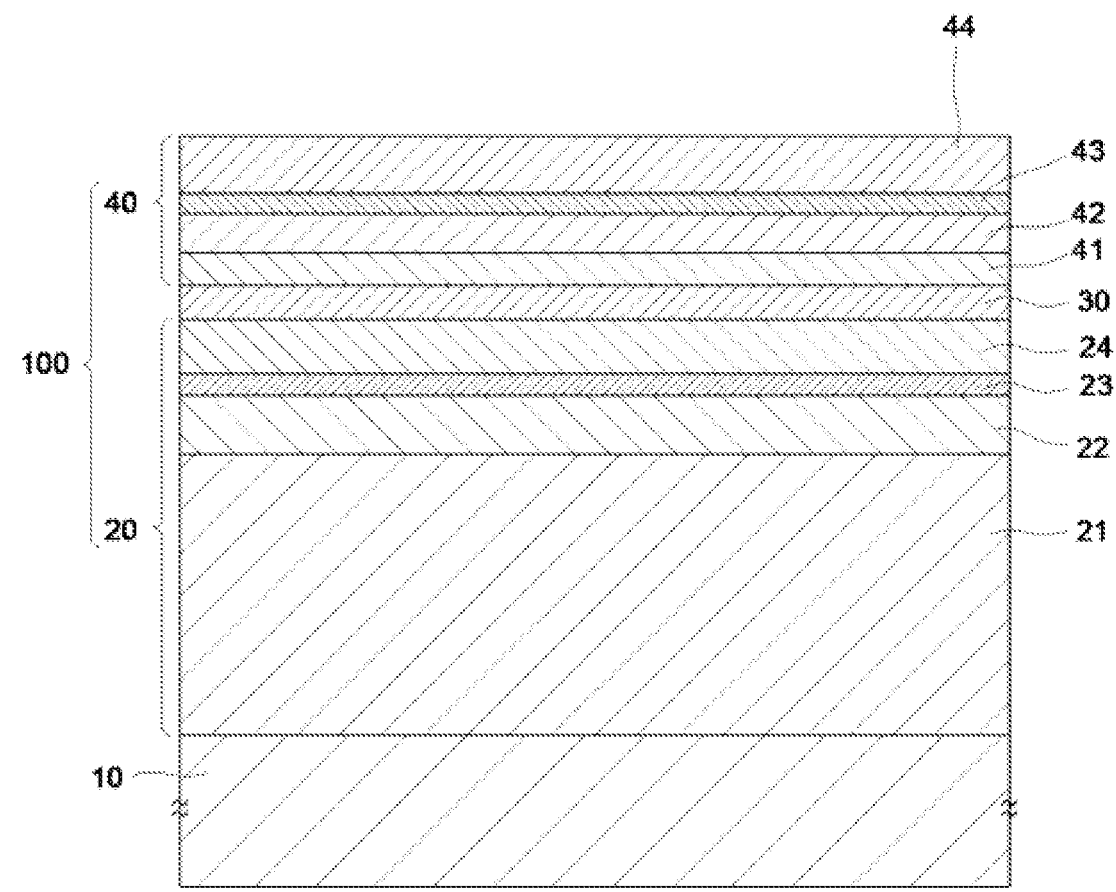
FIG. 4 is a schematic diagram explaining the method of manufacturing a light emitting element according to the embodiment of the present invention.

A method of manufacturing a light emitting element according to this embodiment will be explained next. FIG. 2 to FIG. 4 are schematic cross-sectional views explaining the method of manufacturing a light emitting element 1 according to this embodiment.

Each of the nitride semiconductor layers of the semiconductor structure 100 described above is, for example, epitaxially grown on a substrate 10 by MOCVD (metal organic chemical vapor deposition) in a pressure and temperature adjustable chamber.

Each nitride semiconductor layer can be formed by introducing into the chamber a carrier gas and a source gas. For the carrier gas, hydrogen ($H_2$) gas or nitrogen ($N_2$) gas can be used. For the N source gas, ammonia ($NH_3$) gas can be used. As group 3 raw materials, there are Ga, Al, and In. For the Ga source gas, a trimethyl gallium (TMG) gas, or a triethyl gallium (TEG) gas can be used. For the In source gas, a trimethyl indium (TMI) gas can be used. For the Al source gas, a trimethyl aluminum (TMA) gas can be used. For the Si source gas, a monosilane ($SiH_4$) gas can be used. For the Mg source gas, a bis(cyclopentadienyl)magnesium ($Cp_2Mg$) gas can be used.

A first n-type semiconductor layer forming step is performed first. In the first n-type semiconductor forming step, a first n-type semiconductor layer 21 containing an n-type impurity is formed on a substrate 10. Prior to forming the first n-type semiconductor layer 21 on the substrate 10, a buffer layer may be formed on the surface of the substrate 10.

Then a first superlattice layer forming step is performed. In the first superlattice layer forming step, a first superlattice layer 22 is formed on the first n-type semiconductor layer 21 at a first growth temperature. The first growth temperature can be set, for example, in a range of 840° C. to 1000° C. Setting the first growth temperature to 840° C. or higher can improve the crystalline quality of the first superlattice layer 22. In the case of using an InGaN layer that contains In for the first superlattice layer 22, for example, setting the first growth temperature to 1000° C. at most can reduce the decomposition of indium (In) in the InGaN layer.

Then, a first light emitting layer forming step is performed. In the first light emitting layer forming step, a first light emitting layer 23 is formed on the first superlattice layer 22. The first light emitting layer 23 forming step includes a first well layer forming step and a first barrier layer forming step. By repeating the first well layer forming step and the first barrier layer forming step, a first light emitting layer 23 that includes a plurality of first well layers and a plurality of first barrier layers is formed. In the case of forming first well layers made of InGaN having a 14% to 16% In composition ratio, for example, the growth temperature for use in forming the first well layers can be set in a range of 840° C. to 850° C. The growth temperature for use in forming the first barrier layers can be set, for example, in a range of 840° C. to 1000° C.

Then a first p-type semiconductor layer forming step is performed. In the first p-type semiconductor layer forming step, a first p-type semiconductor layer 24 containing a p-type impurity is formed on the first light emitting layer 23. The growth temperature for use in forming the first p-type semiconductor layer 24 can be set, for example, in a range of 840° C. to 1000° C.

By following these steps, as shown in FIG. 2, a first light emitting part 20 that includes a first n-type semiconductor layer 21, a first superlattice layer 22, a first light emitting layer 23, and a first p-type semiconductor layer 24 is formed on the substrate 10. The step of forming the first light emitting part 20 includes forming a first n-type semiconductor layer, forming a first superlattice layer, forming a first light emitting layer, and forming a first p-type semiconductor layer.

Next, a tunnel junction part forming step is performed. In the tunnel junction part forming step, as shown in FIG. 3, a tunnel junction part 30 is formed on the first light emitting part 20. The tunnel junction part forming step includes, for example, forming on the first light emitting part 20 a first layer 30a containing a p-type impurity, and forming on the first layer 30a a second layer 30b containing an n-type impurity. The p-type impurity concentration of the first layer 30a can be set, for example, in a range of $5\times10^{19}/cm^3$ to $2\times10^{21}/cm^3$. The n-type impurity concentration of the second layer 30b can be set, for example, in a range of $1\times10^{20}/cm^3$ to $5\times10^{21}/cm^3$. The growth temperature for use in forming the tunnel junction part 30 can be set, for example, in a range of 840° C. to 1100° C. The tunnel junction part forming step can simply include at least one of the first layer forming step and the second layer forming step.

Next, a second n-type semiconductor layer forming step is performed. In the second n-type semiconductor layer forming step, a second n-type semiconductor layer 41 containing an n-type impurity is formed on the tunnel junction part 30. The growth temperature for use in forming the second n-type semiconductor layer 41 can be set, for example, in a range of 840° C. to 1100° C.

Then a second superlattice layer forming step is performed. In the second superlattice layer forming step, a second superlattice layer 42 is formed on the second n-type semiconductor layer 41 at a second growth temperature. The second growth temperature is lower than the first growth temperature. The first p-type semiconductor layer 24 and/or the tunnel junction part 30 are formed with a semiconductor layer containing a high concentration p-type impurity. For this reason, if the second superlattice layer 42 is formed at a higher temperature, the thermally diffused p-type impurity might cause unintended doping of the second light emitting layer 43 that will be disposed above the tunnel junction part 30. In this embodiment, the second growth temperature is set to be lower than the first growth temperature in order to reduce thermal diffusion of the p-type impurity to thereby reduce unintended doping of the second light emitting layer 43 with the p-type impurity. Because this can form a high crystalline quality second light emitting part 40 with improved emission efficiency, a high light output light emitting element 1 can be produced. The second growth temperature can be set, for example, in a range of 820° C. to 840° C. Setting the second growth temperature to 820° C. or higher can improve the crystalline quality of the second superlattice layer 42. Setting the second growth temperature to 840° C. at most can reduce the thermal diffusion of the p-type impurity contained in the first p-type semiconductor layer 24 and/or the tunnel junction part 30 stacked prior thereto.

The second growth temperature is preferably set lower than the growth temperature for use in forming the first well layers in the first light emitting layer 23. This can reduce the thermal diffusion of the p-type impurity contained in the first p-type semiconductor layer 24 and/or the tunnel junction part 30 formed ahead of the second superlattice layer 42.

The second growth temperature is preferably set lower than the growth temperature for use in forming the second well layers in the second light emitting layer 43. This can reduce the thermal diffusion of the p-type impurity contained in the first p-type semiconductor layer 24 and/or the tunnel junction part 30 formed ahead of the second superlattice layer 42.

The second growth temperature is preferably set lower than the growth temperature for use in forming the tunnel junction part 30. This can reduce the thermal diffusion of the p-type impurity contained in the first p-type semiconductor layer 24 and/or the tunnel junction part 30 formed ahead of the second superlattice layer 42.

The second growth temperature is preferably set 10° C. to 30° C. lower than the first growth temperature. This can reduce the thermal diffusion of the p-type impurity contained in the first p-type semiconductor layer 24 and/or the tunnel junction part 30 formed ahead of the second superlattice layer 42 while reducing the degradation of the crystalline quality of the second superlattice layer 42.

In the second superlattice layer forming step, a second superlattice layer 42 that includes a plurality of nitride semiconductor layers is formed. At least one of the nitride semiconductor layers of the second superlattice layer 42 is preferably formed at a growth temperature lower than the first growth temperature. This can reduce the thermal diffusion of the p-type impurity contained in the first p-type semiconductor layer 24 and/or the tunnel junction part 30 formed ahead of the second superlattice layer 42.

Next, a second light emitting layer forming step is performed. In the second light emitting layer forming step, a second light emitting layer 43 is formed on the second superlattice layer 42. The step of forming the second light emitting layer 43 includes forming a second well layer and forming a second barrier layer. By repeating the second well layer forming step and the second barrier layer forming step, a second light emitting layer 43 that includes a plurality of second well layers and a plurality of second barrier layers is formed. The growth temperature for use in forming the second well layers, in the case of forming second well layers made of InGaN having a 14% to 16% In composition ratio, for example, can be set in a range of 840° C. to 850° C. The growth temperature for use in forming the second barrier layers can be set, for example, in a range of 840° C. to 1000° C.

Then a second p-type semiconductor layer forming step is performed. In the second p-type semiconductor layer forming step, a second p-type semiconductor layer 44 containing a p-type impurity is formed on the second light emitting layer 43. The growth temperature for use in forming the second p-type semiconductor layer 44 can be set, for example, in a range of 840° C. to 1000° C.

By performing these steps, as shown in FIG. 4, a second light emitting part 40 that includes a second n-type semiconductor layer 41, a second superlattice layer 42, a second light emitting layer 43, and a second p-type semiconductor layer 44 is formed on the tunnel junction part 30. The step of forming the second light emitting part 40 includes forming a second n-type semiconductor layer, forming a second superlattice layer, forming a second light emitting layer, and forming a second p-type semiconductor layer.

By performing the first light emitting part forming step, the tunnel junction part forming step, and the second light emitting part forming step, as shown in FIG. 4, a semiconductor structure 100 that includes on a substrate 10 a first light emitting part 20, a tunnel junction part 30, and a second light emitting part 40 is formed.

Next, a portion of the semiconductor structure 100 is removed to expose a portion of the first n-type semiconductor layer 21. Subsequently, as shown in FIG. 1, an n-side electrode 51 is formed on the first n-type semiconductor layer 21, and a p-side electrode 52 is formed on the second p-type semiconductor layer 44. The n-side electrode 51 and the p-side electrode 52 can be formed, for example, by sputtering, vapor deposition, or the like. By following these steps, a light emitting element 1 shown in FIG. 1 can be produced.

A method of manufacturing a light emitting element according to this embodiment, in which the second growth temperature is set lower than the first growth temperature, can reduce the diffusion of the p-type impurity contained in the first p-type semiconductor layer 24 and/or the tunnel junction part 30 into the second light emitting part 40. This can form a high crystalline quality second light emitting part 40 with improved emission efficiency, thereby achieving a high light output light emitting element 1.

EXAMPLES

Examples 1 to 3 and a Comparative Example will be explained next.

The light emitting elements in Examples 1 to 3 and a Comparative Example were produced as described below, and their light outputs and drive voltage values were evaluated.

First, a method of manufacturing the light emitting element in Example 1 will be explained.

For the substrate 10, a sapphire substrate was used. On the substrate 10, a buffer layer made of undoped AlGaN was formed.

On the buffer layer, an undoped GaN layer was formed as a first n-type semiconductor layer 21, and the undoped GaN layer was doped with Si. On the first n-type semiconductor layer 21, undoped GaN layers and undoped InGaN layers were alternately stacked whereby a first superlattice layer 22 was formed. The thicknesses of a GaN layer and an InGaN layer in the first superlattice layer 22 were set to be about 2 nm and about 1 nm, respectively. Twenty sets of the GaN layer and InGaN layer were stacked. The first growth temperature used in forming the first superlattice layer 22 was about 860° C.

Next, on the first superlattice layer 22, as a first light emitting layer 23, first well layers made of undoped InGaN and first barrier layers made of undoped GaN were alternately stacked. Seven sets of alternating first well layers and first barrier layers were formed. The growth temperature used in forming the first well layers was about 840° C. The In composition ratio of the InGaN first well layers was about 15%.

On the first light emitting layer 23, a Mg-doped AlGaN layer, an undoped GaN layer, and a Mg-doped GaN layer were successively formed as a first p-type semiconductor layer 24. The Mg concentration of the first p-type semiconductor layer 24 was about $3 \times 10^{20}/cm^3$. The growth temperature used in forming the first p-type semiconductor layer 24 was about 900° C.

Next, on the first p-type semiconductor layer 24, a Si-doped GaN layer was formed as a tunnel junction part 30. The tunnel junction part 30 was formed to have a Si concentration of about $1 \times 10^{20}/cm^3$ to about $5 \times 10^{20}/cm^3$. The thickness of the Si-doped GaN layer in the tunnel junction part 30 was about 35 nm. The growth temperature used in forming the tunnel junction part 30 was about 960° C.

Then on the tunnel junction part 30, a Si-doped GaN layer was formed as a second n-type semiconductor layer 41. The second n-type semiconductor layer 41 was formed to have a thickness of about 100 nm.

Next, on the second n-type semiconductor layer 41, twenty sets of alternating layers of Si-doped GaN and Si-doped InGaN were formed as a second superlattice layer 42. The thicknesses of each GaN layer and each InGaN layer in the second superlattice layer 42 were about 2 nm and about 1 nm, respectively. The second growth temperature used in forming the second superlattice layer 42 was about 830° C., which was 30° C. lower than the first growth temperature used in forming the first superlattice layer 22.

Next, on the second superlattice layer 42, second well layers made of undoped InGaN and second barrier layers made of undoped GaN were alternately stacked as a second light emitting layer 43. Seven sets of alternating second well layers and second barrier layers were formed. The growth temperature used in forming the second well layers was about 840° C. The In composition ratio of the InGaN second well layers was about 15%.

Next, on the second light emitting layer 43, a Mg-doped AlGaN layer, an undoped GaN layer, and a Mg-doped GaN layer were successively formed as a second p-type semiconductor layer 44.

Then a portion of the surface of the first n-type semiconductor layer 21 was exposed by removing from the second p-type semiconductor layer 44 side a portion of the second light emitting part 40, the tunnel junction part 30, and a portion of the first light emitting part 20. Subsequently, on the exposed surface of the first n-type semiconductor layer 21, an n-side electrode 51 was formed, and on the surface of the second p-type semiconductor layer 44, a p-side electrode 52 was formed.

In the manner described above, a light emitting element 1 having a semiconductor structure 100 was produced as Example 1.

The light emitting elements 1 in Examples 2 and 3 were produced under the same conditions of the manufacturing method as in Example 1 except for using different growth temperatures in forming the second superlattice layer 42. In Example 2, the second growth temperature used for the second super lattice layer 42 was 840° C. In Example 3, the second growth temperature used for the second super lattice layer 42 was 850° C.

Comparative Example

The light emitting element in a Comparative Example was produced under the same conditions as Example 1 except for using a different growth temperature for forming the second superlattice layer 42. In the Comparative Example, the second super lattice layer 42 was grown at the same growth temperature as that for forming the first superlattice layer 22.

Figure 5:
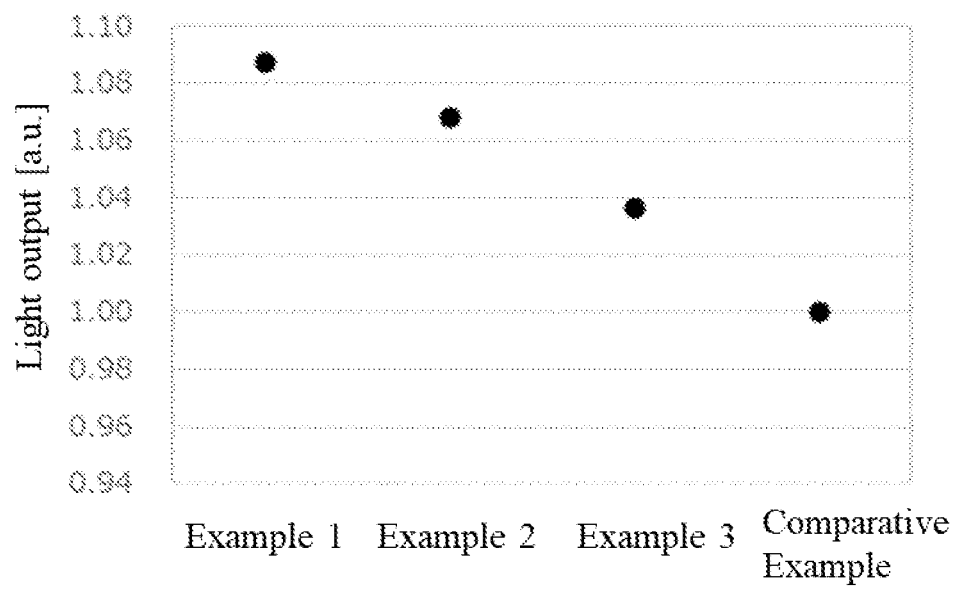
FIG. 5 is a chart showing the light outputs of the light emitting elements according to the examples of the present invention and a comparative example.

FIG. 5 shows the light output evaluation results of the light emitting elements in Examples 1 to 3 and the Comparative Example. As shown in FIG. 5, the light outputs of the light emitting elements in Examples 1 to 3 were higher than that of the light emitting element in the Comparative Example. It was confirmed that setting a lower second growth temperature for the second superlattice layer 42 than the first growth temperature used for the first superlattice layer 22 increases light output.

Figure 6:
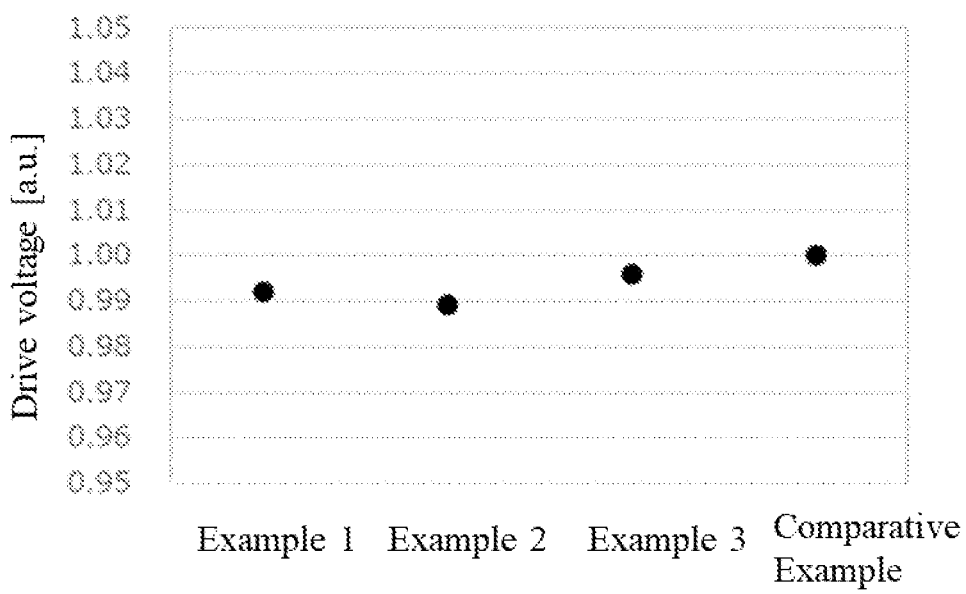
FIG. 6 is a chart showing drive voltages of the light emitting elements according to the examples of the present invention and the comparative example.

FIG. 6 shows the drive voltage evaluation results of the light emitting elements in Examples 1 to 3 and the Comparative Example. The drive voltage values in FIG. 6 are values relative to the drive voltage of the Comparative Example which is 1. As shown in FIG. 6, the drive voltages were similar among Examples 1 to 3 and the Comparative Example.

It was confirmed from the results of Examples 1 to 3 and the Comparative Example described above that a manufacturing method of this embodiment can increase the light output of a light emitting element.

In the foregoing, certain embodiments of the present invention have been explained with reference to specific examples. The present invention, however, is not limited to these specific examples. All forms implementable by a person skilled in the art by suitably making design changes based on any of the embodiments of the present invention described above also fall within the scope of the present invention so long as they encompass the subject matter of the present invention. Furthermore, various modifications and alterations within the spirit of the present invention that could have been made by a person skilled in the art also fall within the scope of the present invention.

What is claimed is:

1. A method of manufacturing a light emitting element, the method comprising:
    forming a first n-type semiconductor layer containing an n-type impurity;
    forming, on the first n-type semiconductor layer, a first superlattice layer, wherein the first superlattice layer is grown at a first growth temperature;
    forming, on the first superlattice layer, a first light emitting layer;
    forming, on the first light emitting layer, a first p-type semiconductor layer containing a p-type impurity;
    forming, on the first p-type semiconductor layer, a tunnel junction part;
    forming, on the tunnel junction part, a second n-type semiconductor layer containing an n-type impurity;
    forming, on the second n-type semiconductor layer, a second superlattice layer, wherein the second superlattice layer is grown at a second growth temperature that is lower than the first growth temperature;
    forming, on the second superlattice layer, a second light emitting layer; and
    forming, on the second light emitting layer, a second p-type semiconductor layer containing a p-type impurity.

2. The method of manufacturing a light emitting element according to claim 1 wherein the tunnel junction part is grown at a temperature that is higher than the second growth temperature.

3. The method of manufacturing a light emitting element according to claim 1, wherein:

in the step of forming the first light emitting layer, the first light emitting layer is formed to comprise a plurality of first well layers, and a plurality of first barrier layers having larger band gap energies than the first well layers; and the first well layers are grown at a temperature that is higher than the second growth temperature.

4. The method of manufacturing a light emitting element according to claim 2, wherein:

in the step of forming the first light emitting layer, the first light emitting layer is formed to comprise a plurality of first well layers, and a plurality of first barrier layers having larger band gap energies than the first well layers; and the first well layers are grown at a temperature that is higher than the second growth temperature.

5. The method of manufacturing a light emitting element according to claim 1, wherein:

in the step of forming the second light emitting layer, the second light emitting layer is formed to comprise a plurality of second well layers, and a plurality of second barrier layers having larger band gap energies than the second well layers; and the second well layers are grown at a temperature that is higher than the second growth temperature.

6. The method of manufacturing a light emitting element according to claim 2, wherein in the step of forming the second light emitting layer, the second light emitting layer is formed to comprise a plurality of second well layers, and a plurality of second barrier layers having larger band gap energies than the second well layers; and the second well layers are grown at a temperature that is higher than the second growth temperature.

7. The method of manufacturing a light emitting element according to claim 3, wherein in the step of forming the second light emitting layer, the second light emitting layer is formed to comprise a plurality of second well layers, and a plurality of second barrier layers having larger band gap energies than the second well layers; and the second well layers are grown at a temperature that is higher than the second growth temperature.

8. The method of manufacturing a light emitting element according to claim 1, wherein the second growth temperature is 10° C. to 30° C. lower than the first growth temperature.

9. The method of manufacturing a light emitting element according to claim 2, wherein the second growth temperature is 10° C. to 30° C. lower than the first growth temperature.

10. The method of manufacturing a light emitting element according to claim 3, wherein the second growth temperature is 10° C. to 30° C. lower than the first growth temperature.

11. The method of manufacturing a light emitting element according to claim 1, wherein, in the step of forming the second superlattice layer, the second superlattice layer is formed to comprise a plurality of nitride semiconductor layers, at least one of the nitride semiconductor layers in the second superlattice layer being grown at a growth temperature that is lower than the first growth temperature.

12. The method of manufacturing a light emitting element according to claim 2, wherein, in the step of forming the second superlattice layer, the second superlattice layer is formed to comprise a plurality of nitride semiconductor layers, at least one of the nitride semiconductor layers in the second superlattice layer being grown at a growth temperature that is lower than the first growth temperature.

13. The method of manufacturing a light emitting element according to claim 3, wherein, in the step of forming the second superlattice layer, the second superlattice layer is formed to comprise a plurality of nitride semiconductor layers, at least one of the nitride semiconductor layers in the second superlattice layer being grown at a growth temperature that is lower than the first growth temperature.

14. The method of manufacturing a light emitting element according to claim 5, wherein, in the step of forming the second superlattice layer, the second superlattice layer is formed to comprise a plurality of nitride semiconductor layers, at least one of the nitride semiconductor layers in the second superlattice layer being grown at a growth temperature that is lower than the first growth temperature.

15. The method of manufacturing a light emitting element according to claim 1, wherein an n-type impurity concentration of the tunnel junction part is in a range of $1 \times 10^{20}/cm^3$ to $5 \times 10^{21}/cm^3$.

16. The method of manufacturing a light emitting element according to claim 2, wherein an n-type impurity concentration of the tunnel junction part is in a range of $1 \times 10^{20}/cm^3$ to $5 \times 10^{21}/cm^3$.

17. The method of manufacturing a light emitting element according to claim 3, wherein an n-type impurity concentration of the tunnel junction part is in a range of $1 \times 10^{20}/cm^3$ to $5 \times 10^{21}/cm^3$.

18. The method of manufacturing a light emitting element according to claim 1, wherein the first growth temperature is in a range of 840° C. to 1000° C.

19. The method of manufacturing a light emitting element according to claim 2, wherein the first growth temperature is in a range of 840° C. to 1000° C.

20. The method of manufacturing a light emitting element according to claim 3, wherein the first growth temperature is in a range of 840° C. to 1000° C.

* * * * *